(12) United States Patent
Hofmann et al.

(10) Patent No.: US 10,598,316 B2
(45) Date of Patent: Mar. 24, 2020

(54) FILAMENT, METHOD OF PRODUCING A FILAMENT AND A LIGHT SOURCE INCLUDING A FILAMENT

(71) Applicant: OSRAM OLED GmbH, Regensburg (DE)

(72) Inventors: Markus Hofmann, Bad Abbach (DE); Thomas Schlereth, Pentling (DE); Michael Bestele, Lappersdorf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/086,824

(22) PCT Filed: Mar. 17, 2017

(86) PCT No.: PCT/EP2017/056345
§ 371 (c)(1),
(2) Date: Sep. 20, 2018

(87) PCT Pub. No.: WO2017/162530
PCT Pub. Date: Sep. 28, 2017

(65) Prior Publication Data
US 2019/0086036 A1 Mar. 21, 2019

(30) Foreign Application Priority Data
Mar. 21, 2016 (DE) .................. 10 2016 105 211

(51) Int. Cl.
*F21V 33/00* (2006.01)
*F21K 9/232* (2016.01)
(Continued)

(52) U.S. Cl.
CPC .............. *F21K 9/232* (2016.08); *F21V 29/85* (2015.01); *H01L 25/0753* (2013.01);
(Continued)

(58) Field of Classification Search
None
See application file for complete search history.

(56) References Cited

U.S. PATENT DOCUMENTS 8,809,887 B2 * 8/2014 Zhu ................. H01L 33/58
257/98
9,065,022 B2 6/2015 Pu et al.
(Continued)

FOREIGN PATENT DOCUMENTS

CN 101080827 A 11/2007
CN 101578714 A 11/2009
(Continued)

OTHER PUBLICATIONS

The First Office Action dated Sep. 11, 2019, of counterpart Chinese Application No. 201780019266.2, along with an English translation.

*Primary Examiner* — Vip Patel
(74) *Attorney, Agent, or Firm* — DLA Piper LLP (US)

(57) ABSTRACT

A filament includes a radiation-transmissive substrate, a plurality of light emitting diodes and a converter layer, wherein the substrate has an upper side and a lower side facing away from the upper side, and the LEDs are arranged on the upper side of the substrate, the converter layer covers the LEDs, the upper side and the lower side of the substrate, and the converter layer has a first sublayer on the upper side and a second sublayer on the lower side, and the converter layer is configured to obtain an improved radiation profile of the filament such that the converter layer has a varying vertical layer thickness along a lateral direction, and/or the first sublayer and the second sublayer differ from one another in their geometry and/or material composition.

16 Claims, 5 Drawing Sheets

(51) Int. Cl.
  *H01L 33/50*   (2010.01)
  *H01L 25/075*  (2006.01)
  *F21V 29/85*   (2015.01)
  *H01L 33/44*   (2010.01)
  *F21Y 115/10*  (2016.01)
  *H01L 25/16*   (2006.01)
  *F21Y 103/10*  (2016.01)

(52) U.S. Cl.
  CPC ............ *H01L 33/44* (2013.01); *H01L 33/505* (2013.01); *H01L 33/507* (2013.01); *H01L 33/508* (2013.01); *F21Y 2103/10* (2016.08); *F21Y 2115/10* (2016.08); *H01L 25/167* (2013.01); *H01L 33/501* (2013.01); *H01L 33/504* (2013.01); *H01L 2933/0041* (2013.01)

(56) References Cited

U.S. PATENT DOCUMENTS

| | | |
|---|---|---|
| 9,123,868 B2 | 9/2015 | Pan et al. |
| 2008/0084159 A1 | 4/2008 | Fery et al. |
| 2010/0065861 A1 | 3/2010 | Nagai |
| 2011/0038150 A1 | 2/2011 | Woodgate et al. |
| 2014/0104838 A1 | 4/2014 | Reiss et al. |
| 2014/0197440 A1 | 7/2014 | Ye et al. |
| 2014/0369036 A1 | 12/2014 | Feng |
| 2015/0003039 A1 | 1/2015 | Liu et al. |
| 2015/0070871 A1 | 3/2015 | Chen et al. |
| 2015/0364452 A1 | 12/2015 | Zhu |
| 2017/0016582 A1 | 1/2017 | Yang et al. |

FOREIGN PATENT DOCUMENTS

| | | |
|---|---|---|
| CN | 102171503 A | 8/2011 |
| CN | 203277380 U | 11/2013 |
| CN | 103456728 A | 12/2013 |
| CN | 103730561 A | 4/2014 |
| CN | 104409607 A | 3/2015 |
| CN | 204289442 U | 4/2015 |
| CN | 105098032 A | 11/2015 |
| DE | 10 2007 024 784 A1 | 11/2008 |
| DE | 20 2013 009 434 U1 | 12/2013 |
| EP | 2 535 640 A1 | 12/2012 |

* cited by examiner

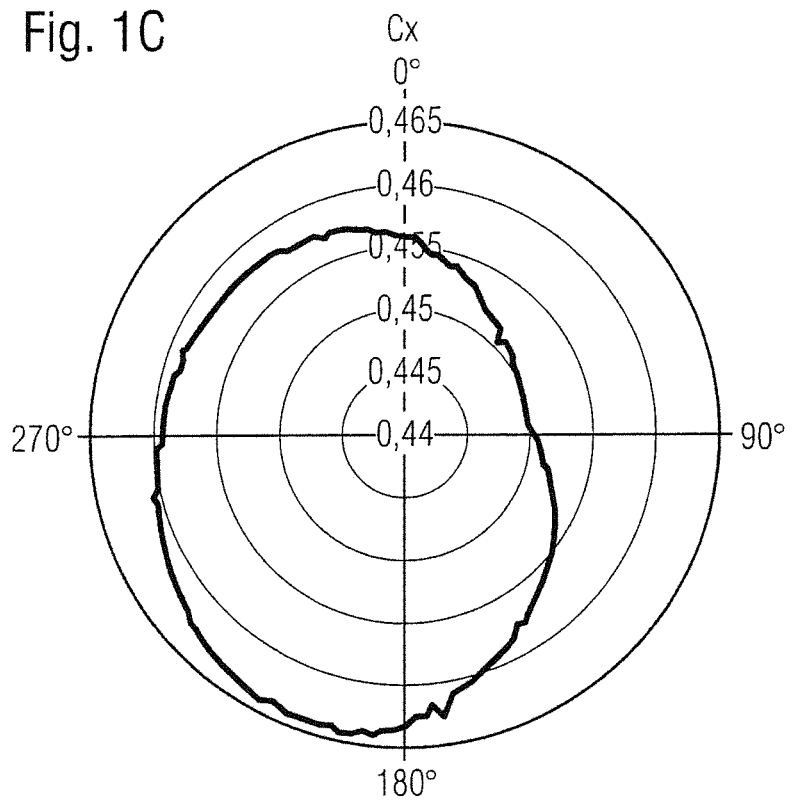
Fig. 1C
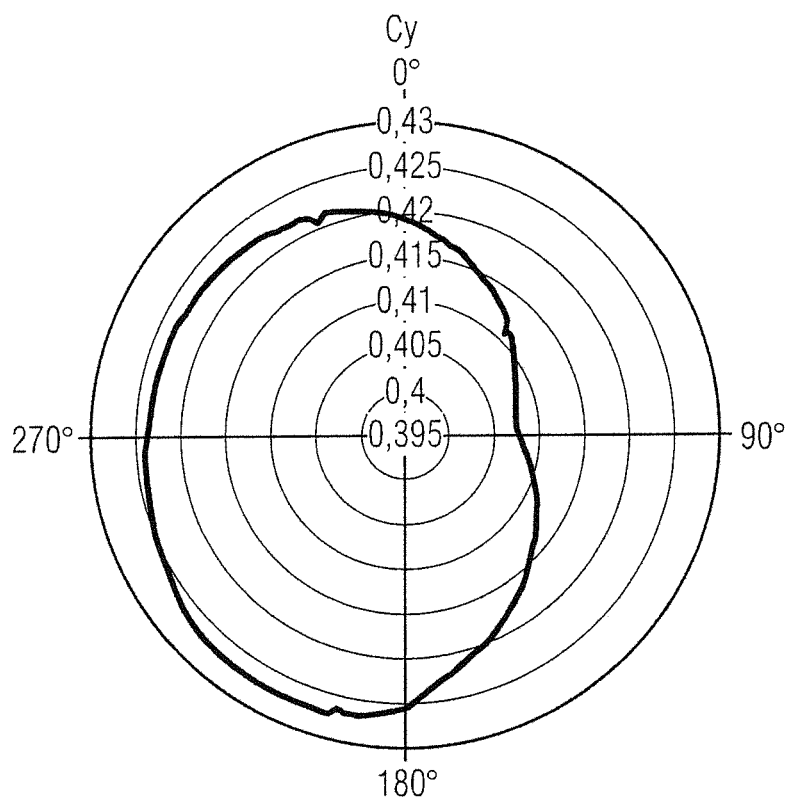

FILAMENT, METHOD OF PRODUCING A FILAMENT AND A LIGHT SOURCE INCLUDING A FILAMENT

TECHNICAL FIELD

This disclosure relates to a filament, a light source having a plurality of filaments and a method of producing one or a plurality of filaments.

BACKGROUND

LED filaments are increasingly used in the production of retrofit lamps for general lighting. In an LED filament, LED chips are arranged on a common linear substrate and encased in a converter layer. When switched on, such an arrangement appears as a classic glowing filament to the viewer. However, a large deviation from the classic filament can be found in the radiation profile, especially with regard to color location and/or brightness distribution. Known LED filaments have a radiation profile that shows large inhomogeneities in brightness and color location, both over a radial angle and over a polar angle. Those inhomogeneities also lead to inhomogeneous illumination in the end product, for example, in an LED retrofit lamp.

It could therefore be helpful to provide a filament and a light source including a plurality of filaments having an improved radiation profile, which has a particularly low inhomogeneity in brightness and/or color location.

SUMMARY

We provide a filament including a radiation-transmissive substrate, a plurality of light emitting diodes and a converter layer, wherein the substrate has an upper side and a lower side facing away from the upper side, and the LEDs are arranged on the upper side of the substrate, the converter layer covers the LEDs, the upper side and the lower side of the substrate, and the converter layer has a first sublayer on the upper side and a second sublayer on the lower side, and the converter layer is configured to obtain an improved radiation profile of the filament such that the converter layer has a varying vertical layer thickness along a lateral direction, and/or the first sublayer and the second sublayer differ from one another in their geometry and/or material composition.

We also provide a light source having a plurality of filaments including a radiation-transmissive substrate, a plurality of light emitting diodes and a converter layer, wherein the substrate has an upper side and a lower side facing away from the upper side, and the LEDs are arranged on the upper side of the substrate, the converter layer covers the LEDs, the upper side and the lower side of the substrate, and the converter layer has a first sublayer on the upper side and a second sublayer on the lower side, and the converter layer is configured to obtain an improved radiation profile of the filament such that the converter layer has a varying vertical layer thickness along a lateral direction, and/or the first sublayer and the second sublayer differ from one another in their geometry and/or material composition.

We further provide a method of producing a filament including a radiation-transmissive substrate, a plurality of light emitting diodes and a converter layer, including providing the substrate, placing the LEDs on an upper side of the substrate, applying the converter layer to the upper side and a lower side of the substrate facing away from the upper side so that the converter layer covers the LEDs, the upper side and the lower side of the substrate, wherein the converter layer has a first sublayer on the upper side and a second sublayer on the lower side and is configured to obtain an improved radiation profile of the filament such that the converter layer has a varying vertical layer thickness along a lateral direction, and/or the first sublayer and the second sublayer differ from one another in their geometry and/or material composition.

We also further provide a filament including a radiation-transmissive substrate, a plurality of light emitting diodes and a converter layer, wherein the substrate has an upper side and a lower side facing away from the upper side, and the LEDs are arranged on the upper side of the substrate, the converter layer covers the LEDs, the upper side and the lower side of the substrate, and the converter layer has a first sublayer on the upper side and a second sublayer on the lower side, the first sublayer of the converter layer includes a first matrix material and the second sublayer of the converter layer includes a second matrix material different from the first matrix material, the first matrix material has a first refractive index and the second matrix material has a second refractive index, and an absolute value of the difference between the first refractive index and the second refractive index is at least 0.05, and the converter layer is configured to obtain an improved radiation profile of the filament such that the converter layer has a varying vertical layer thickness along a lateral direction, and/or the first sublayer and the second sublayer differ from one another in their geometry and/or material composition.

BRIEF DESCRIPTION OF THE DRAWINGS

FIGS. 1A, 1B and 1C shows a light source having a plurality of filaments and radiation profiles of the light source or of a filament.

LIST OF REFERENCE NUMERALS

Figure 1A:
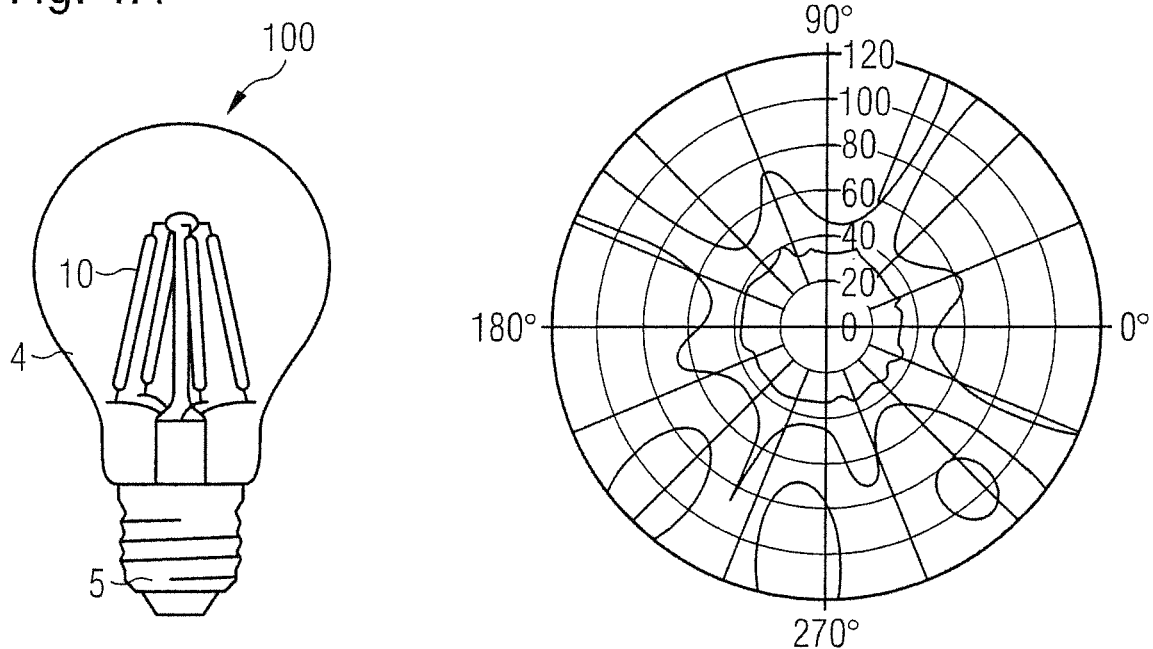

10 Filament
100 Light source
1 Substrate
11 Upper side of the substrate
12 Lower side of the substrate
2 Light emitting diode (LED)
3 Converter layer
31 First sublayer of the converter layer
32 Second sublayer of the converter layer
4 Housing
5 Socket
D Layer thickness of the converter layer
D1 Layer thickness of the first sublayer
D2 Layer thickness of the second sublayer

DETAILED DESCRIPTION

Our filament has a radiation-transmissive substrate, a plurality of light-emitting diodes (LEDs) and a converter layer. The substrate has an upper side and a lower side facing away from the upper side. The LEDs are located for instance on the upper side of the substrate. The converter layer covers the LEDs, the upper side and the lower side of the substrate, wherein the converter layer has a first sublayer on the upper side and a second sublayer on the lower side. To obtain an improved radiation profile of the filament, the converter layer is arranged such that the converter layer has a varying vertical layer thickness along a lateral direction, and/or the first sublayer and the second sublayer differ from each other in their geometry and/or material composition. In relation to the substrate, the converter layer may have an asymmetry with respect to its geometry and/or material composition.

A vertical direction means a direction perpendicular to a main extension surface of the substrate. A lateral direction means a direction parallel to the main extension surface of the substrate. The vertical direction and the lateral direction are therefore particularly perpendicular to each other. With regard to its geometry, the converter layer can have a varying layer thickness along a lateral direction. Alternatively or additionally, with regard to their geometry, the sublayers may have different dimensions such as different layer thicknesses and/or different shapes. Furthermore, alternatively or in addition, with respect to their material composition, the sublayers may contain different types of phosphors, phosphor compositions and/or different matrix materials.

Some or all LEDs may be arranged such that they emit electromagnetic radiation of a first peak wavelength during operation. The converter layer may contain first phosphor particles that at least partially convert the electromagnetic radiation of the first peak wavelength into electromagnetic radiation of a second peak wavelength, wherein the first peak wavelength and the second peak wavelength differ from each other. In particular, the first and second peak wavelengths differ from each other by at least 50 nm, for instance by at least 100 nm or by at least 150 nm. For example, the first peak wavelength belongs to the ultraviolet or blue spectral range. The second peak wavelength can belong to the green, yellow or red spectral range.

By a targeted adjustment of the converter layer with respect to its layer thickness along the lateral direction and/or its geometry and/or its material composition on the upper side and on the lower side of the substrate, a compensation with respect to the brightness radiation profile and/or the color location profile of the filament is achieved in vertical or lateral directions. Among other things, this is due to different optical path lengths of the emitted or converted electromagnetic radiation in different directions through the converter layer. The optical path length depends in particular on the actual distance that the emitted or converted electromagnetic radiation travels within the converter layer and on the material composition of the converter layer such as on the refractive index of the converter layer. By varying the vertical layer thickness of the converter layer along the lateral direction and/or by designing the converter layer regarding its geometry and/or material composition to be asymmetrical in relation to the substrate, the electromagnetic radiation emitted by the LEDs may have different optical path lengths in different directions within the converter layer, as a result of which the filament as a whole has an improved radiation profile both in terms of brightness distribution and color location distribution.

The converter layer may comprise a plurality of different types of phosphors. In addition to the first phosphor particles that convert the radiation of the first peak wavelength into radiation of the second peak wavelength, the converter layer may contain further phosphor particles that at least partially convert the electromagnetic radiation of the first peak wavelength into electromagnetic radiation of a third peak wavelength. The first peak wavelength, the second peak wavelength and the third peak wavelength may differ from each other by at least 50 nm or by at least 100 nm. In particular, the phosphor composition of the converter layer is configured such that a superposition of the electromagnetic radiation of the first, second and third peak wavelengths results in light that appears white to the human eye.

All LEDs may be configured such that they emit electromagnetic radiation of the first peak wavelength during operation. The radiation of the first peak wavelength can belong to an ultraviolet or blue spectral range. In contrast to this, it is also possible that different groups of LEDs arranged on the substrate emit electromagnetic radiation of different peak wavelengths.

The converter layer may have a varying vertical layer thickness along a lateral direction. The converter layer can have a varying vertical layer thickness along a lateral longitudinal direction and/or along a lateral transverse direction. The lateral longitudinal direction and the lateral transverse direction are in particular perpendicular to each other. The substrate has a length for instance along the lateral longitudinal direction and a width along the lateral transverse direction, wherein the length is greater than the width. In particular, the length shall be at least 5 times, for instance 10 times or at least 30 times greater than the width of the substrate.

Along a lateral direction, the converter layer may have an increasing or decreasing vertical layer thickness from a center of the substrate, for instance from a geometric center or a center of gravity of the substrate, to an edge or to the edges of the substrate. In particular on the upper side or on the lower side of the substrate, the vertical layer thickness of the converter layer can be monotonously decreasing or monotonously increasing for instance from the center to an edge or to the edges of the substrate. Alternatively, it is also possible that the vertical layer thickness of the converter layer changes along the lateral direction such that the vertical layer thickness of the converter layer increases in some regions and decreases in other regions. The variation in the vertical layer thickness of the converter layer can be continuous or discontinuous. With a continuous change in the vertical layer thickness, the converter layer can have an essentially continuous surface. If the vertical layer thickness changes discontinuously, the converter layer may have a surface having local step-like structures. It is also possible for the vertical layer thickness of the converter layer to vary along the lateral directions such that the converter layer has a surface having a periodic pattern.

The first sublayer may have a first layer thickness and the second sublayer may have a second layer thickness. If the converter layer has a varying vertical layer thickness along a lateral direction, both sublayers of the converter layer can each have a varying vertical layer thickness along this lateral direction. Alternatively, it is also possible that only one sublayer of the converter layer has a varying vertical layer thickness, while the other sublayer of the converter layer has a substantially constant vertical layer thickness, i.e., constant up to manufacturing tolerances, for example.

The first layer thickness and the second layer thickness may differ from each other. In particular, the LEDs on the upper side of the substrate may be fully embedded in the first sublayer of the converter layer. The first sublayer can be formed to be thicker than the second sublayer. In this case, the first sublayer has a greater layer thickness than the second sublayer. The layer thickness means the average layer thickness. Alternatively, the second layer thickness can be greater than the first layer thickness. In particular, a ratio of the second layer thickness to the first layer thickness or a ratio of the first layer thickness to the second layer thickness is 1.5 to 4, for instance 1.5 to 3 or 1.5 to 2.

The first sublayer of the converter layer may have a first phosphor composition. The second sublayer of the converter layer may have a second phosphor composition different from the first phosphor composition. For example, the first sublayer and the second sublayer can have different types or kinds of phosphor particles. The first sublayer and the second sublayer can have the same matrix material such as silicone, wherein the phosphor particles of the first sublayer or of the second sublayer are embedded therein. The phosphor particles of the first and second sublayers can partially absorb the electromagnetic radiation of the first peak wavelength emitted by the LEDs and convert it into electromagnetic radiation of different peak wavelengths. It is possible for the first sublayer and the second sublayer to have different concentrations of the same or different types of phosphor particles.

The first sublayer may have a first matrix material. The second sublayer may have a second matrix material different from the first matrix material. The phosphor particles of the first sublayer and of the second sublayer are embedded in particular in the first matrix material and in the second matrix material, respectively. For example, the first matrix material and the second matrix material are different types of silicones. In this case, the first sublayer and the second sublayer may have the same phosphor composition.

The first matrix material may have a first refractive index and the second matrix material may have a second refractive index, wherein an absolute value of the difference between the first refractive index and the second refractive index is at least 0.05, for instance at least 0.1 or at least 0.2 or at least 0.3. The first refractive index may be greater than the second refractive index, or vice versa. The first sublayer and the second sublayer of the converter layer can therefore have different refractive indices. The refractive index of a layer means an average refractive index of this layer, measured for instance at a wavelength around 550 nm or around 590 nm.

Our light source may have a plurality of filaments. The light source can have a radiation-transmissive bulb-shaped housing and a socket. In particular, the filaments are arranged inside the housing. Especially via the socket, the filaments can be externally electrically connected. The bulb-shaped housing can be made of a radiation-transmissive plastic. It is also possible that the housing is made of glass. In particular, the housing and the socket form a hermetically sealed interior in which the filaments are arranged. The interior can be filled with a gaseous medium having a higher thermal conductivity than that of air. It is also possible for the interior to be filled with air. The housing can take the form of a standard light bulb. The socket can be an Edison socket.

In our method of producing one or a plurality of filaments, a radiation-transmissive substrate is provided. The substrate can be formed by carrier strips made of sapphire or sawing glass. Such a substrate can have a layer thickness of about 0.5 mm, a width of about 1 mm and a length of about 30 mm. The LEDs are placed on the upper side of the substrate. The substrate can have electrical conductor tracks on the upper side and fixed to the substrate by an adhesive connection, for example, by a glass connection, and/or by mechanical bending. The conductor paths can be formed such that they clasp the substrate in regions. Alternatively or additionally, the conductor tracks can be fixed to the substrate by a metal-glass connection.

The converter layer is applied onto the upper side and the lower side of the substrate, for example, by dispensing or injection molding so that the converter layer covers the LEDs, the upper side and the lower side of the substrate. In a plan view, the LEDs are preferably completely covered by the converter layer. The substrate can be completely enclosed in places by the converter layer. At its lateral ends, however, the substrate can be free of the converter layer in regions, as a result of which the conductor tracks arranged on the substrate are exposed in places for the purpose of external electrical connecting. Alternatively, it is also possible for the substrate to be enclosed by the converter layer in all directions. For the external contacting of the LEDs, the conductor tracks arranged on the substrate can be formed such that they protrude from the converter layer at the lateral ends of the substrate.

The converter layer may be formed on the substrate and on the LEDs such that the converter layer has a varying vertical layer thickness along a lateral direction. Alternatively or additionally, the converter layer having a first sublayer on the upper side and a second sublayer on the lower side of the substrate can be formed such that the first sublayer and the second sublayer differ from one another with regard to their geometry, for example, with regard to their layer thickness or their shape and/or their material composition. In particular, the converter layer can be formed in the form of two strips each on the upper side and on the lower side of the substrate. The first sublayer and the second sublayer of the converter layer can be formed in a common method step or in separate method steps. The converter layer having the first sublayer and the second sublayer can be formed to be one-piece. It is also possible for the sublayers of the converter layer to be formed as separate strips that can adjoin each other in particular directly.

To produce a plurality of filaments, a plurality of rows of LEDs can be arranged on a common substrate. The common substrate comprising the plurality of LED rows can be singulated into a plurality of filaments. Prior to or after the singulation, to form the converter layer, a converter material can be applied onto the upper side and the lower side of the substrate or of the common substrate.

To form the first sublayer of the converter layer, a converter material having a first viscosity is applied onto the upper side of the substrate. To form the second sublayer of the converter layer, a converter material in particular having a second viscosity being different from the first viscosity is applied onto the lower side of the substrate. The converter material comprises a matrix material and in particular phosphor particles, wherein the phosphor particles are embedded in the matrix material. The phosphor particles in the first matrix material and in the second matrix material may be alike or different. Preferably, the converter material having the first viscosity has a matrix material different from a matrix material of the converter material having the second viscosity. By using different converter materials having different viscosities, an asymmetry between the first sublayer and the second sublayer with regard to their layer thickness and/or geometry can be realized in a simplified manner.

The first sublayer and the second sublayer may be formed simultaneously by a casting method to obtain any predetermined shape of the converter layer. A casting method is generally understood to mean a method by which a molding compound is formed under the influence of pressure and, if necessary, cured in accordance with a predetermined shape. In particular, "casting" includes molding, film assisted molding, injection molding, transfer molding and compression molding.

To obtain any arbitrary predetermined shape of the converter layer, the first sublayer and the second sublayer may be formed simultaneously by an injection molding process.

In other words, the entire converter layer is formed in a single common process step. By an injection molding process, any arbitrary predetermined shape of the converter layer can be realized in a simplified manner. For example, a varying shape along the longitudinal axis of the filament or a varying shape of a lateral cross-section of the converter layer can be realized by an injection molding process in a simplified manner.

The method described above is particularly suitable for the production of one or a plurality of filaments described herein. Features described in connection with the filament can therefore also be used for the method, and vice versa.

Further advantages, preferred constructions and developments of the filament or of the light source will become apparent from examples explained below in conjunction with FIGS. 1A to 3.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

FIG. 1A on the left shows an LED retrofit bulb 100 having a plurality of filaments 10 within a housing 4. The housing 4 is in particular a radiation-transmissive bulb fixed to a socket 5. FIG. 1A on the right shows the brightness or luminance L of an LED retrofit light bulb over a radial angle of between 0° and 360°. In conventional filaments 10, the LED retrofit light bulb 100 exhibits considerable inhomogeneities with regard to brightness and luminance distribution over both radial angle and polar angle.

Figure 1B:
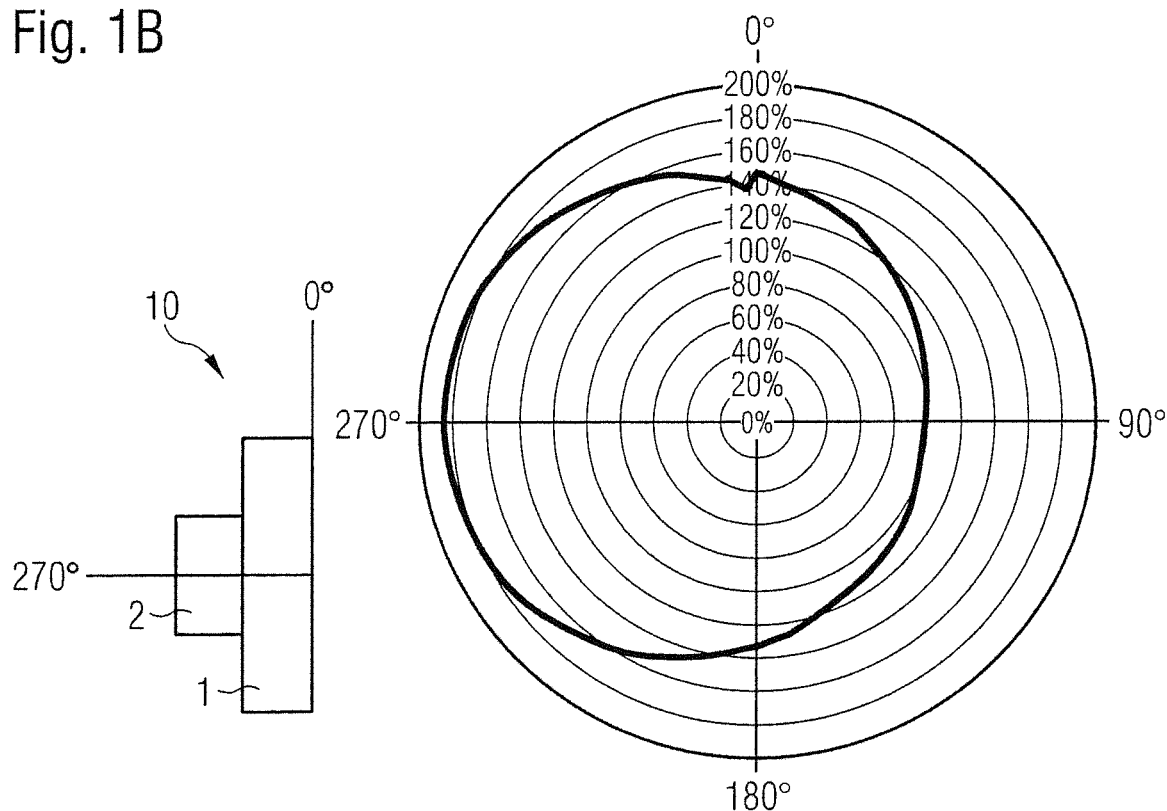

FIG. 1B shows on the left a filament 10 having a substrate 1 and a plurality of LEDs 2 arranged on the substrate 1. Such a known filament 10 exhibits large fluctuations in brightness or luminance L as a function of a radial angle. Such a distribution is shown on the right of FIG. 1B as a function of L depending on a radial angle of between 0° and 360°.

Furthermore, we found that known filaments have a radiation profile which shows significant inhomogeneities with regard to color location, namely both over the radial angle and over the polar angle. FIG. 1C shows chromatic coordinates Cx and Cy as functions of the radial angle of between 0° and 360°, wherein Cx and Cy are chromatic coordinates in a CIE diagram. As shown in FIGS. 1B and 1C, the brightness or luminance and the color location of the radiation generated by the known filaments are strongly dependent on the angle.

It turned out that the filaments or light sources having such filaments as described in FIGS. 2A to 2G each have a significantly improved radiation profile regarding both brightness or luminance distribution and color location distribution in all spatial directions.

Figure 2A:
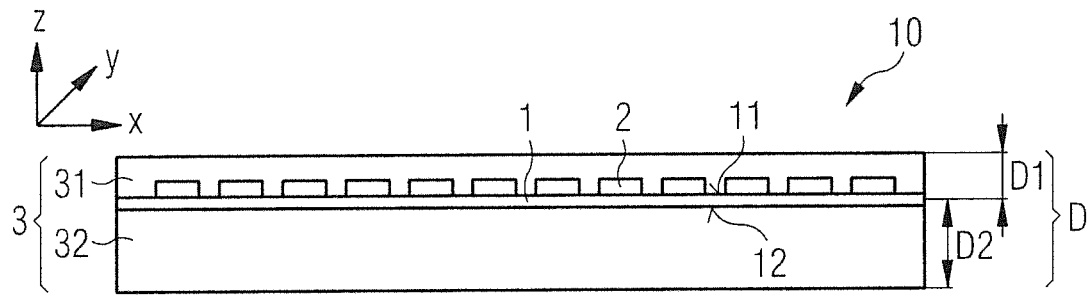
FIGS. 2A, 2B, 2C, 2D, 2E, 2F and 2G show different examples of a filament in schematic sectional views.

FIG. 2A shows a filament 10. The filament 10 has a substrate 1 having an upper side 11 and a lower side 12. A plurality of light emitting diodes 2 are located on the upper side 11 of the substrate 1. The filament 10 has a converter layer 3. According to FIG. 2A, the converter layer 3 has a first sublayer 31 on the upper side 11 and a second sublayer 32 on the lower side 12 of the substrate 1. The plurality of LEDs 2 are completely embedded in the converter layer 3, in particular in the first sublayer 31 of the converter layer 3.

The converter layer 3 can be formed in one piece. In this case, the first sublayer 31 and the second sublayer 32 only formally label a subregion of the converter layer 3 on the upper side 11 and a further subregion of the converter layer 3 on the lower side 12 of the substrate 1. In particular, the first sublayer 31 and the second sublayer 32 may be produced in a common process step. Alternatively, the first sublayer 31 and the second sublayer 32 of converter layer 3 can be formed as separate layers of converter layer 3, wherein the sublayers 31 and 32 preferably adjoin each other directly. In this case, the sublayers 31 and 32 may be at least partially produced in different production steps.

The converter layer 3 has a vertical layer thickness D. The vertical direction is indicated by the Z-direction in FIG. 2A. The first sublayer 31 has a first layer thickness D1. The second sublayer 32 has a second vertical layer thickness D2. In FIG. 2A, the first layer thickness D1 and the second layer thickness D2 differ from each other. In particular, a ratio between the first layer thickness D1 and the second layer thickness D2 may be 1.5 to 4. FIG. 2A shows that the first layer thickness D1 is smaller than the second layer thickness D2. In contrast to this, the second layer thickness D2 may be smaller than the first layer thickness D1.

In particular, the substrate 1 is configured to be radiation-transmissive. Electrical conductor tracks can be formed on the substrate 1 for electrically contacting the LEDs 2 (not shown in FIG. 2A for the sake of clarity). During operation, the LEDs 2 are configured to generate electromagnetic radiation of a first peak wavelength, for example. The converter layer 3 can contain a plurality of phosphor particles which at least partially convert the electromagnetic radiation of the first peak wavelength into electromagnetic radiation of further peak wavelengths. The further peak wavelengths can be different from each other and from the first peak wavelength. The converter layer 3 can have different types of phosphor particles and is especially configured such a way that a superimposition of the electromagnetic radiation emitted by the LEDs 2 with the radiation converted by the converter layer results in white light.

The LEDs 2 can be formed as volume emitters. The LEDs 2 can be configured such that the electromagnetic radiation emitted by the LEDs 2 can exit the LEDs 2 in all directions. The radiation emitted by the LEDs 2 or the radiation converted by the converter layer 3 can escape from the filament 10 on surfaces of the first sublayer 31 and the second sublayer 32. According to FIG. 2A, the plurality of LEDs 2 are located only on the upper side 11 of the substrate 1. Deviating from this, it is also possible for the LEDs 2 to be arranged in part on the lower side 12 of the substrate 1.

Along a lateral longitudinal direction, marked as X-direction in FIG. 2A, the LEDs 2 form in particular a row of LEDs. For example, the LEDs 2 electrically connect in series. It is also possible that the filament 10 has further LEDs connected in parallel to one or to a group of LEDs electrically connected in series. It is also possible that filament 10 comprises at least one protective element connected in particular parallel to at least one of the LEDs 2 or to a group of LEDs 2, wherein the protective element is configured such that the protective element can be activated if the at least one LED 2 or one of the group of LEDs 2 is no longer functional. Due to such a protective element or to at least one or a plurality of LEDs connected in parallel to the LEDs connected in series, the filament 10 can be prevented from failure if one or a group of LEDs 2 connected in series is no longer functional.

The substrate 1 can be a glass or a sapphire substrate. The substrate can have a vertical layer thickness, i.e., along the Z-direction, of approximately 0.5 mm. Furthermore, the substrate 1 can have a length along the lateral longitudinal direction, i.e., along the X-direction shown in FIG. 2A, of approximately 30 mm. Along a lateral transverse direction, i.e., along the Y-direction shown in FIG. 2A, the substrate 1 can have a lateral width of approximately 1 mm.

The filament 10, as shown in FIG. 2A, has an asymmetry in relation to the substrate 1 with respect to its geometry, namely due to the different layer thicknesses D1 and D2 of the sublayers 31 and 32. The first sublayer 31 and the second sublayer 32 can have the same material composition. For example, the first sublayer 31 and the second sublayer 32 may have the same converter material, in particular the same type of phosphor particles embedded in the same matrix material. Alternatively, the first sublayer 31 and the second sublayer 32 can have different types of phosphor particles and/or different matrix materials. For example, the first sublayer 31 contains a first matrix material having a first refractive index, for instance a first silicone carrier material, wherein the second sublayer 32 may contain a second matrix material, for instance a second silicone carrier material, which is different from the first matrix material and has a second refractive index different from the first refractive index.

If the sublayers 31 and 32 have different matrix materials and/or different phosphor compositions, the sublayers 31 and 32 can be applied, for example, dispensed onto the upper side 11 and the lower side 12, respectively, in the form of two strips. To form the first sublayer 31, it is also possible to apply a converter material having a first viscosity onto the upper side of the substrate, wherein, to form the second sublayer 32, a further converter material having a second viscosity different from the first viscosity is applied onto the lower side 12 of the substrate. It is also possible for the converter material and the further converter material to have the same phosphor composition or different phosphor compositions. Due to the different viscosities of the converter materials, the first sublayer 31 and the second sublayer 32 can be formed with different layer thicknesses in a simplified manner.

Figure 2B:
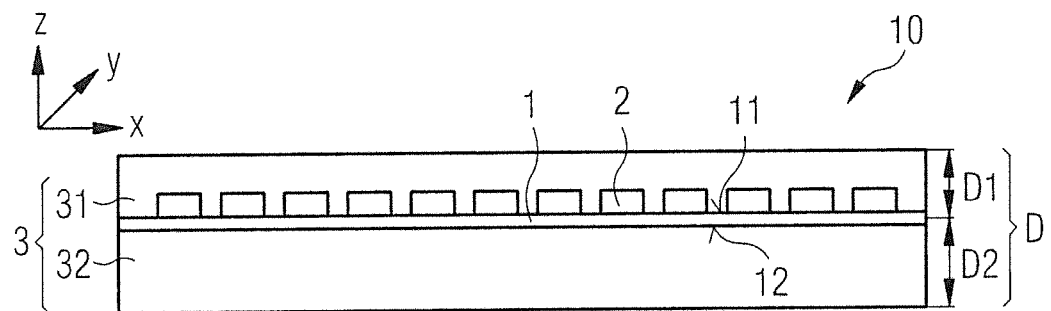

The example of a filament 10 shown in FIG. 2B essentially corresponds to the example of a filament 10 shown in FIG. 2A. In contrast thereto, the sublayers 31 and 32 can be formed such that the sublayers have substantially the same layer thicknesses within manufacturing tolerances. In other words, a ratio between the first layer thickness D1 and the second layer thickness D2 can be approximately 1. However, the first sublayer 31 and the second sublayer 32 may differ from each other with regard to their material composition, in particular with regard to the phosphor composition and/or the respective matrix material. For example, the sublayers 31 and 32 shown in FIG. 2B have different refractive indices. In particular, the sublayers 31 and 32 can have the same geometry, for example, regarding their layer thickness or the shape of their respective sublayers. In particular, in relation to the substrate 1, the sublayers 31 and 32 are symmetrical, for instance mirror-symmetrical.

Figure 2C:
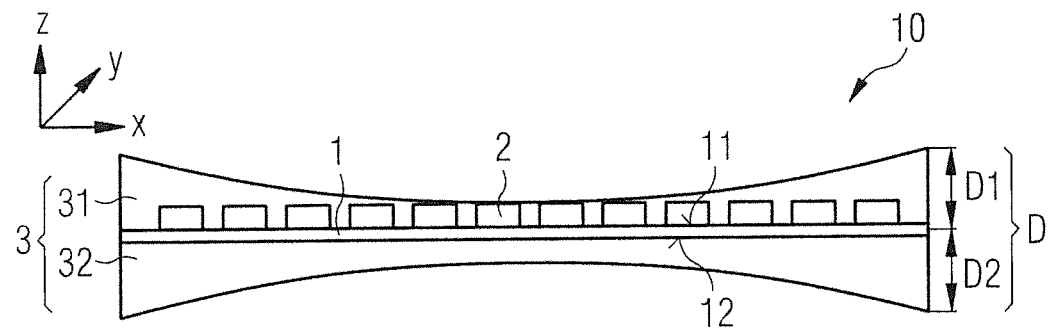

The example shown in FIG. 2C substantially corresponds to the example of a filament 10 shown in FIG. 2B. In contrast thereto, the converter layer 3 has a varying vertical layer thickness D along the lateral longitudinal direction. In particular, the vertical layer thickness D of the converter layer 3 increases monotonously with increasing vertical distance from a center, for example, from a geometric center or a center of gravity, of the substrate 1. This also applies to the first layer thickness D1 of the first sublayer 31 and to the second layer thickness D2 of the second sublayer 32.

In relation to the substrate 1, for example, on an XY plane, the first sublayer 31 is formed to be mirror-symmetrical to the second sublayer 32. In FIG. 2C, the first sublayer 31 and the second sublayer 32 are for instance mirror-symmetrical to each other with respect to a YZ plane extending perpendicular to substrate 1 and through the center of substrate 1.

The converter layer 3 shown in FIG. 2C can thus have the shape of a hyperboloid. In contrast to FIG. 2C, the sublayers 31 and 32 may be asymmetrical with respect to the substrate 1. For example, one of the sublayers 31 or 32 may have a substantially constant vertical layer thickness along the lateral longitudinal direction, while the other one of the sublayers 31 or 32 has a layer thickness varying along the lateral longitudinal direction. It is also possible for the sublayers 31 and 32 to have different local layer thicknesses.

Figure 2D:
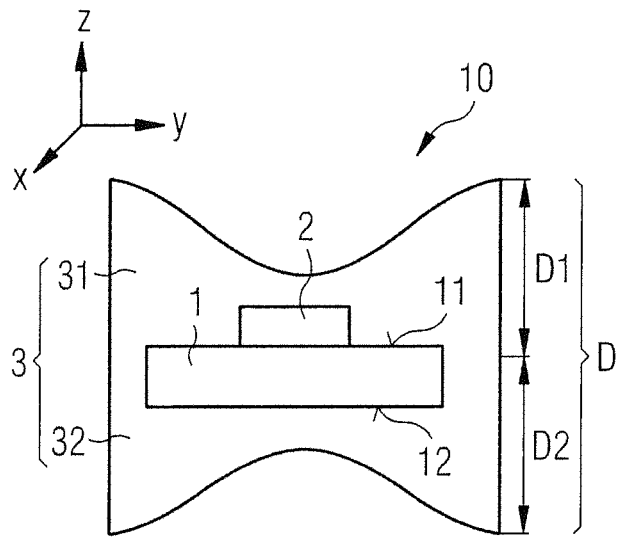

The example shown in FIG. 2D essentially corresponds to the example of a filament 10 shown in FIG. 2C. In contrast thereto, the filament is not shown in the XZ plane but in the YZ plane. Alternatively or in addition to the example of a filament 10 shown in FIG. 2C, the converter layer 3 in FIG. 2D can have a varying vertical layer thickness D along the lateral transverse direction, i.e., along the Y-direction. In particular, the features of the filament 10 described above in connection with FIG. 2C along the lateral longitudinal direction can be used analogously for the filament 10 shown in FIG. 2D along the lateral transverse direction. Alternatively, it is possible for the vertical layer thickness D to vary only along the lateral transverse direction and to remain essentially constant along the lateral longitudinal direction, or vice versa.

Figure 2E:
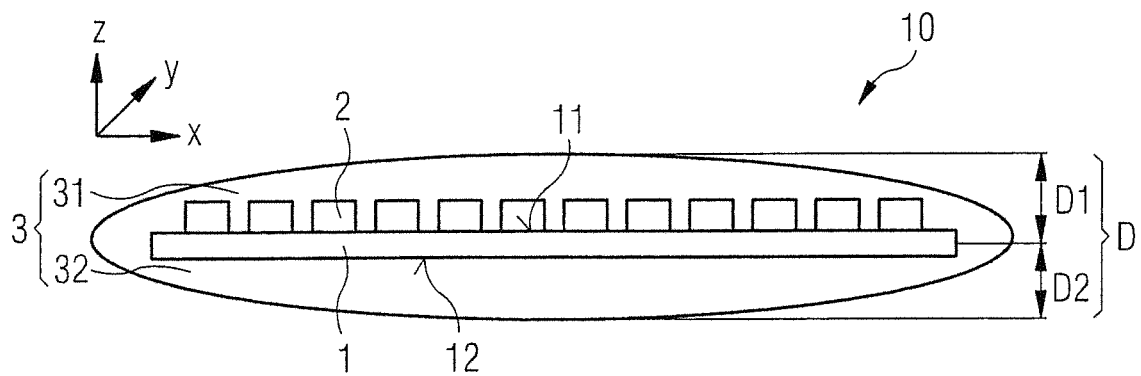

The example shown in FIG. 2E essentially corresponds to the example of a filament 10 shown in FIG. 2C. In contrast thereto, the converter layer 3 essentially has the shape of an ellipsoid. In contrast to FIGS. 2A and 2B, where the cross-section of the converter layer 3 is for instance rectangular, the cross-section of the converter layer 3 shown in FIG. 2E is elliptical. The vertical layer thickness D of the converter layer 3 and the layer thicknesses D1 and D2 of the sublayers 31 and 32 vary in particular along the lateral longitudinal direction and/or along the lateral transverse direction.

According to FIGS. 2C to 2E, the converter layer 3 or the respective sublayers 31 and 32 of the converter layer 3 each have a substantially continuously varying vertical layer thickness along the lateral direction, namely along the lateral longitudinal direction and/or the lateral transverse direction.

Figure 2F:
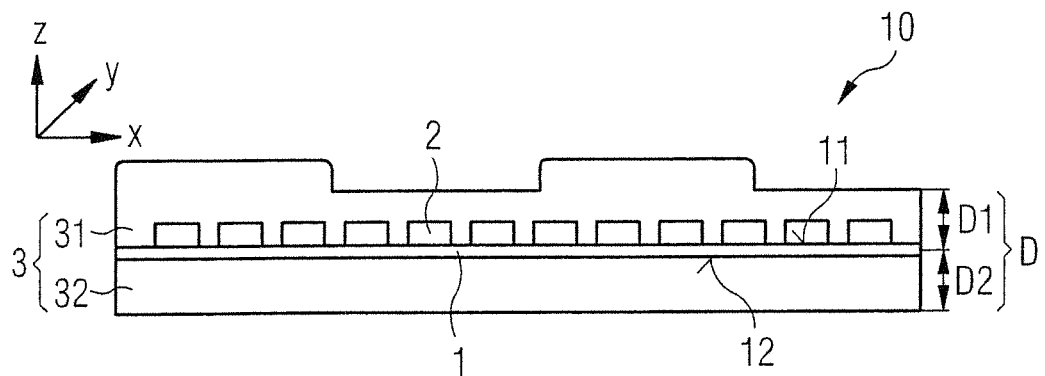

The example shown in FIG. 2F essentially corresponds to the example of a filament 10 shown in FIG. 2A or 2B. In contrast thereto, the converter layer 3 has a vertical layer thickness D that varies discontinuously along the lateral direction at least in places. A contour line of the first sublayer 31 has the shape of a step in regions. In a plan view of the substrate 1, the first sublayer 31 can have a periodic pattern. According to FIG. 2F, the second layer thickness D2 of the second sublayer 32 is substantially constant along the lateral longitudinal direction. It is also possible that the first sublayer 31 has a substantially constant layer thickness along the lateral longitudinal direction, wherein the second sublayer 32 may have a varying vertical layer thickness along the lateral longitudinal direction. It is also possible that both the first layer thickness D1 of the first sublayer 31 and the second layer thickness D2 of the second sublayer 32 vary along the lateral longitudinal direction and/or along the lateral transverse direction.

Figure 2G:
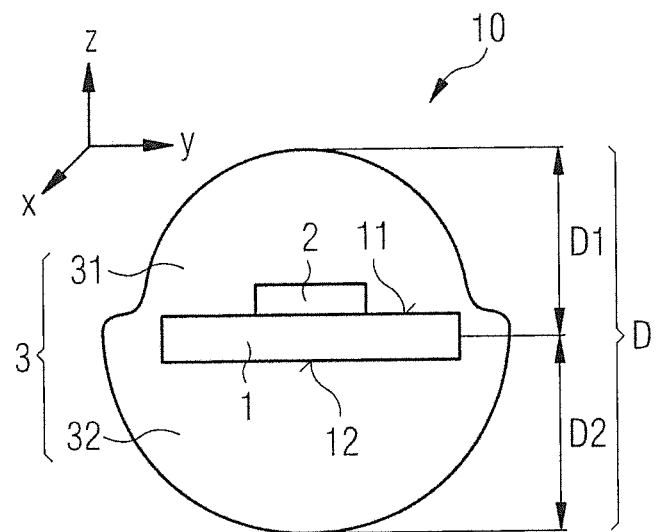

The example shown in FIG. 2G essentially corresponds to the example of a filament 10 shown in FIG. 2D. In contrast to the example as shown in FIG. 2D, the first sublayer 31 and the second sublayer 32 do not have concavely curved surfaces but, as shown in FIG. 2G, convexly curved surfaces. Furthermore, with respect to the substrate 1, the first sublayer 31 and the second sublayer 32 have an asymmetry regarding the dimensions of their sublayers 31 and 32. In particular, the cross-section of the first sublayer 31 has a smaller radius than that of the second sublayer 32. Both the first sublayer 31 and the second sublayer 32 have a varying layer thickness D1 and D2 along the lateral transverse direction. Locally, the first layer thickness D1 is smaller than the second layer thickness D2. In contrast to FIG. 2D, it is also possible that locally, the first sublayer 31 has a greater layer thickness than the second sublayer 32. According to FIG. 2G, the sublayers 31 and 32 each have a higher order surface. In other words, each of the surfaces of the sublayers can be continuously differentiable several times. To obtain any given shape of the converter layer, the converter layer 3, in particular shown in FIGS. 2C to 2G, can be formed in a simplified manner by an injection molding process.

In summary, to obtain an improved radiation profile of a filament 10 or of a light source having a plurality of such filaments, the converter layer 3 in all examples according to FIGS. 2A to 2G is configured such that the converter layer 3 has a varying vertical layer thickness along a lateral direction and/or that the first sublayer 31 and the second sublayer 32 differ from one another with regard to their geometry, for instance to their layer thickness or shape, and/or their material composition. By a targeted adjustment of the converter layer 3 on the upper side 11 and on the lower side 12 of the substrate, a compensation with regard to different brightness radiation profiles and/or color location radiation profiles is achieved in all spatial directions, namely in the vertical direction, in the lateral transverse direction and in the lateral longitudinal direction.

Figure 3:
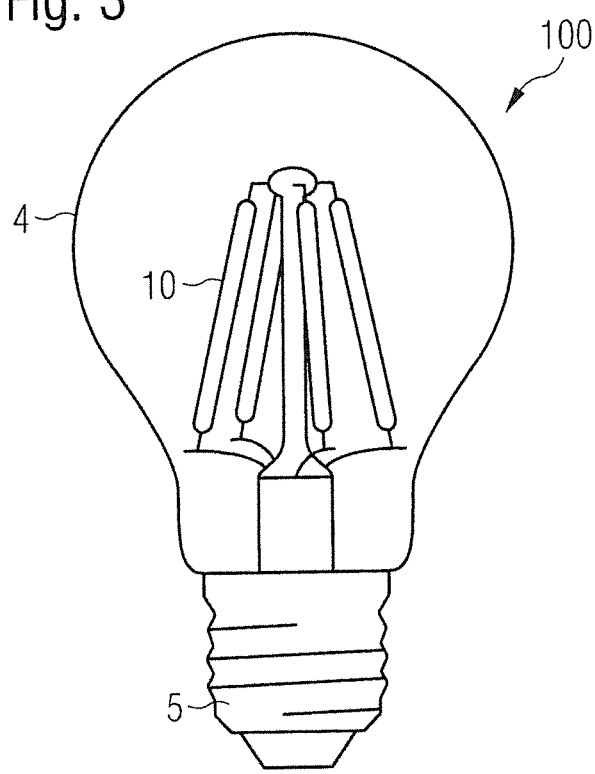
FIG. 3 shows a schematic illustration of a light source having a plurality of filaments.

FIG. 3 shows a light source 100 having a plurality of filaments 10 described here. The light source 100 is especially an LED retrofit light bulb. The light source 100 comprises a radiation-transmissive bulb-shaped housing 4 and a socket 5. The filaments 10 are arranged inside the housing 4 and can be externally electrically contacted especially via the socket 5. The use of the filaments 10 also leads to an improved radiation profile with regard to the brightness or luminance distribution or the color location distribution of the light source 100.

This application claims priority of DE 10 2016 105 211.6, the subject matter of which is incorporated herein by reference.

Our filament, methods and light sources are not restricted to this disclosure made with reference to examples. This disclosure rather comprises any novel feature and any combination of features, including in particular any combination of features in the appended claims, even if the feature or combination is not itself explicitly indicated in the claims or examples.

The invention claimed is:

1. A filament comprising a radiation-transmissive substrate, a plurality of light emitting diodes and a converter layer, wherein
the substrate has an upper side and a lower side facing away from the upper side, and the LEDs are arranged on the upper side of the substrate,
the converter layer covers the LEDs, the upper side and the lower side of the substrate, and the converter layer has a first sublayer on the upper side and a second sublayer on the lower side,
the converter layer is configured to obtain a radiation profile of the filament,
the first sublayer and the second sublayer differ from one another in their material composition,
the first sublayer of the converter layer comprises a first matrix material and the second sublayer of the converter layer comprises a second matrix material different from the first matrix material,
the first matrix material has a first refractive index and the second matrix material has a second refractive index, and
an absolute value of the difference between the first refractive index and the second refractive index is at least 0.05.

2. The filament according to claim 1, wherein along a lateral direction the converter layer has a continuously varying vertical layer thickness, and the lateral direction is a lateral longitudinal direction parallel to a main extension surface of the substrate and the substrate has a length expanding along the lateral longitudinal direction greater than a width of the substrate along a lateral transverse direction.

3. The filament according to claim 1, wherein along a lateral direction the converter layer has a varying vertical layer thickness, and the first sublayer and the second sublayer differ from one another in their geometry and material composition.

4. The filament according to claim 1, wherein in operation the LEDs emit electromagnetic radiation of a first peak wavelength and the converter layer contains phosphor particles that at least partially convert the electromagnetic radiation of the first peak wavelength into electromagnetic radiation of a second peak wavelength, and the first peak wavelength and the second peak wavelength differ from one another.

5. The filament according to claim 4, wherein the converter layer contains further phosphor particles that at least partially convert the electromagnetic radiation of the first peak wavelength into electromagnetic radiation of a third peak wavelength, the first peak wavelength, the second peak wavelength and the third peak wavelength each differ from one another by at least 100 nm, and a superposition of the electromagnetic radiations of the first, second and third peak wavelengths results in light appearing white to the human eye.

6. The filament according to claim 1, wherein along a lateral direction, the converter layer has a vertical layer thickness that varies discontinuously at least in regions, and the lateral direction is a lateral longitudinal direction parallel to a main extension surface of the substrate and the substrate has a length expanding along the lateral longitudinal direction greater than a width of the substrate along a lateral transverse direction.

7. The filament according to claim 6, wherein the converter layer has a surface comprising local step-shaped structures or a surface comprising a periodic pattern.

8. The filament according to claim 1, wherein the first sublayer has a first layer thickness and the second sublayer has a second layer thickness, and the first layer thickness and the second layer thickness differ from each other.

9. The filament according to claim 8, wherein a ratio of the first layer thickness and the second layer thickness to each other is 1.5 to 4.

10. The filament according to claim 1, wherein the first sublayer of the converter layer has a first phosphor composition and the second sublayer of the converter layer has a second phosphor composition different from the first phosphor composition.

11. The filament according to claim 1, wherein the absolute value of the difference between the first refractive index and the second refractive index is at least 0.2 and the substrate is completely enclosed in places by the converter layer.

12. The filament according to claim 1, wherein the LEDs electrically connect in series with one another, the filament has at least one protective element connected in parallel to at least one of the LEDs or to a group of LEDs, and the protective element is configured such that the protective element can be activated when the at least one LED or one of the group of LEDs is no longer functional.

13. A light source having a plurality of filaments according to claim 1.

14. The light source according to claim 13, further comprising a radiation-transmissive bulb-shaped housing and a socket, wherein the filaments are arranged inside the housing and are externally electrically contactable via the socket.

15. A method of producing a filament comprising a radiation-transmissive substrate, a plurality of light emitting diodes and a converter layer, comprising:
  providing the substrate,
  placing the LEDs on an upper side of the substrate,
  applying the converter layer to the upper side and a lower side of the substrate facing away from the upper side so that the converter layer covers the LEDs, the upper side and the lower side of the substrate, wherein the converter layer has a first sublayer on the upper side and a second sublayer on the lower side and is configured to obtain a radiation profile of the filament such that
    the converter layer has a varying vertical layer thickness along a lateral direction, or
    the first sublayer and the second sublayer differ from one another in at least one of their geometry or material composition,
  wherein
    to form the first sublayer of the converter layer, a converter material having a first viscosity is applied to the upper side of the substrate, and
    to form the second sublayer of the converter layer, a converter material having a second viscosity different from the first viscosity is applied to the lower side of the substrate.

16. A filament comprising a radiation-transmissive substrate, a plurality of light emitting diodes and a converter layer, wherein
  the substrate has an upper side and a lower side facing away from the upper side, and the LEDs are arranged on the upper side of the substrate,
  the converter layer covers the LEDs, the upper side and the lower side of the substrate, and the converter layer has a first sublayer on the upper side and a second sublayer on the lower side,
  the first sublayer of the converter layer comprises a first matrix material and the second sublayer of the converter layer comprises a second matrix material different from the first matrix material,
  the first matrix material has a first refractive index and the second matrix material has a second refractive index, and an absolute value of the difference between the first refractive index and the second refractive index is at least 0.2, and
  the converter layer is configured to obtain a radiation profile of the filament.

* * * * *